(12) United States Patent
Delaus et al.

(10) Patent No.: US 9,407,997 B2
(45) Date of Patent: Aug. 2, 2016

(54) MICROPHONE PACKAGE WITH EMBEDDED ASIC

(75) Inventors: Michael D. Delaus, Andover, MA (US); Kathy O'Donnell, Arlington, MA (US); Thomas M. Goida, Windham, NH (US)

(73) Assignee: INVENSENSE, INC., San Jose, CA (US)

( * ) Notice: Subject to any disclaimer, the term of this patent is extended or adjusted under 35 U.S.C. 154(b) by 83 days.

(21) Appl. No.: 13/272,045

(22) Filed: Oct. 12, 2011

(65) Prior Publication Data

US 2012/0087521 A1     Apr. 12, 2012

Related U.S. Application Data

(60) Provisional application No. 61/392,322, filed on Oct. 12, 2010.

(51) Int. Cl.
| | |
|---|---|
| *H04R 25/00* | (2006.01) |
| *H04R 19/00* | (2006.01) |
| *B81C 1/00* | (2006.01) |
| *H04R 19/04* | (2006.01) |

(52) U.S. Cl.
CPC .......... *H04R 19/005* (2013.01); *B81C 1/00238* (2013.01); *B81C 1/00309* (2013.01); *H04R 19/04* (2013.01); *B81B 2201/0257* (2013.01); *B81C 2203/0785* (2013.01); *H01L 2224/48091* (2013.01); *H01L 2224/48137* (2013.01); *H01L 2224/73265* (2013.01); *H01L 2924/1461* (2013.01); *H01L 2924/3025* (2013.01)

(58) Field of Classification Search
CPC .... H04R 19/04; H04R 19/016; H04R 19/005; H04R 23/006; H04R 1/083; H04R 1/086; B81B 2201/0257; B81C 1/00238; B81C 1/00309; B81C 2203/0785; H01L 2224/48091; H01L 224/48137; H01L 2224/73265; H01L 2924/3025; H01L 2924/1461
USPC ..................... 257/416; 381/175, 369
See application file for complete search history.

(56) References Cited

U.S. PATENT DOCUMENTS

| | | | |
|---|---|---|---|
| 4,722,914 A | 2/1988 | Drye et al. | 437/213 |
| 6,118,357 A | 9/2000 | Tomasevic et al. | 333/247 |
| 6,239,496 B1 | 5/2001 | Asada | 257/777 |

(Continued)

FOREIGN PATENT DOCUMENTS

| | | | |
|---|---|---|---|
| DE | 10056776 A1 | 10/2001 | H01L 49/02 |
| WO | WO 02/01633 A1 | 1/2002 | H01L 23/10 |

(Continued)

OTHER PUBLICATIONS

Kopola, H., et al., "MEMS Sensor Packaging Using LTCC Substrate Technology," *Proceedings of SPIE*, vol. 4592, 2001, pp. 148-158.

(Continued)

*Primary Examiner* — Duc Nguyen
*Assistant Examiner* — Sean H Nguyen
(74) *Attorney, Agent, or Firm* — Maryam Imam; IPxLaw Group LLP

(57) ABSTRACT

A packaged microphone has a base, a lid coupled to the base forming an interior, a MEMS microphone secured to the base within the interior, and an integrated circuit embedded in the base. Apertures in the base and integrated circuit are aligned to form an aperture from the exterior of the package to the interior.

16 Claims, 10 Drawing Sheets

(56) References Cited

U.S. PATENT DOCUMENTS

| | | | |
|---|---|---|---|
| 6,271,801 B2 | 8/2001 | Tuttle et al. | 343/872 |
| 6,309,912 B1 | 10/2001 | Chiou et al. | 438/118 |
| 6,528,351 B1 | 3/2003 | Nathan et al. | 438/118 |
| 6,639,324 B1 | 10/2003 | Chien | 257/778 |
| 6,844,606 B2 | 1/2005 | Logsdon et al. | 257/434 |
| 6,917,089 B2 | 7/2005 | Schuurmans et al. | 257/427 |
| 6,928,726 B2 | 8/2005 | Zollo et al. | 29/832 |
| 6,987,661 B1 | 1/2006 | Huemoeller et al. | 361/312 |
| 7,002,254 B2 | 2/2006 | Harper et al. | 257/777 |
| 7,134,193 B2 | 11/2006 | Sasaoka et al. | 29/825 |
| 7,166,910 B2 * | 1/2007 | Minervini | 257/704 |
| 7,183,643 B2 | 2/2007 | Gibson et al. | 257/723 |
| 7,196,426 B2 | 3/2007 | Nakamura et al. | 257/778 |
| 7,198,986 B2 | 4/2007 | Sunohara | 438/109 |
| 7,214,565 B2 | 5/2007 | Sunohara | 438/108 |
| 7,217,888 B2 | 5/2007 | Sunohara et al. | 174/260 |
| 7,230,318 B2 | 6/2007 | Kripesh et al. | 257/621 |
| 7,242,591 B2 | 7/2007 | Imamura et al. | 361/761 |
| 7,251,391 B2 | 7/2007 | Murayama | 385/15 |
| 7,286,366 B2 | 10/2007 | Zollo et al. | 361/761 |
| 7,312,536 B2 | 12/2007 | Yamano et al. | 257/787 |
| 7,319,049 B2 | 1/2008 | Oi et al. | 438/106 |
| 7,319,598 B2 | 1/2008 | Steiner et al. | 361/760 |
| 7,325,301 B2 | 2/2008 | Miura | 29/852 |
| 7,326,932 B2 | 2/2008 | Hynes et al. | 250/353 |
| 7,335,531 B2 | 2/2008 | Iijima et al. | 438/106 |
| 7,340,121 B2 | 3/2008 | Yonekura et al. | 385/14 |
| 7,397,830 B2 * | 7/2008 | Ishibashi et al. | 372/34 |
| 7,426,868 B2 | 9/2008 | Fessele et al. | 73/756 |
| 7,434,305 B2 * | 10/2008 | Minervini | 29/594 |
| 7,517,712 B2 | 4/2009 | Stark | 438/51 |
| 8,018,032 B2 | 9/2011 | Lu | 257/622 |
| 8,193,596 B2 * | 6/2012 | Lee et al. | 257/416 |
| 8,199,939 B2 * | 6/2012 | Suvanto et al. | 381/175 |
| 2002/0076041 A1 * | 6/2002 | Hietanen | 379/433.03 |
| 2003/0059976 A1 | 3/2003 | Nathan et al. | 438/110 |
| 2004/0016995 A1 | 1/2004 | Kuo et al. | 257/678 |
| 2005/0046011 A1 | 3/2005 | Chen et al. | 257/705 |
| 2005/0087356 A1 | 4/2005 | Forcier | 174/52.4 |
| 2005/0176209 A1 | 8/2005 | Jorgenson et al. | 438/381 |
| 2005/0189635 A1 * | 9/2005 | Humpston et al. | 257/678 |
| 2006/0246630 A1 | 11/2006 | Sunohara et al. | 438/125 |
| 2006/0258053 A1 | 11/2006 | Lee et al. | 438/118 |
| 2006/0283627 A1 | 12/2006 | Chen et al. | 174/260 |
| 2007/0029654 A1 | 2/2007 | Sunohara et al. | 257/704 |
| 2007/0058826 A1 * | 3/2007 | Sawamoto et al. | 381/174 |
| 2007/0128754 A1 | 6/2007 | Fuergut et al. | 438/48 |
| 2007/0131349 A1 | 6/2007 | Tuominen et al. | 156/280 |
| 2007/0132536 A1 | 6/2007 | Lee et al. | 336/200 |
| 2007/0158822 A1 | 7/2007 | Fujii | 257/704 |
| 2007/0158826 A1 * | 7/2007 | Sakakibara et al. | 257/723 |
| 2007/0177360 A1 | 8/2007 | Shiraishi et al. | 361/740 |
| 2007/0181988 A1 | 8/2007 | Han et al. | 257/678 |
| 2007/0190686 A1 | 8/2007 | Wang | 438/106 |
| 2007/0215913 A1 * | 9/2007 | Okubora | 257/275 |
| 2007/0241451 A1 | 10/2007 | Koizumi et al. | 257/719 |
| 2007/0290329 A1 | 12/2007 | Murayama et al. | 257/704 |
| 2008/0029879 A1 * | 2/2008 | Tuckerman et al. | 257/704 |
| 2008/0040921 A1 | 2/2008 | Zollo et al. | 29/837 |
| 2008/0052904 A1 * | 3/2008 | Schneider et al. | 29/846 |
| 2008/0054486 A1 | 3/2008 | Murayama et al. | 257/774 |
| 2008/0073768 A1 | 3/2008 | Shiraishi et al. | 257/684 |
| 2008/0094805 A1 | 4/2008 | Tuominen et al. | 361/728 |
| 2008/0132053 A1 * | 6/2008 | Wu et al. | 438/612 |
| 2008/0171172 A1 | 7/2008 | Bae et al. | 428/67 |
| 2008/0192450 A1 | 8/2008 | Tuominen et al. | 361/761 |
| 2008/0196930 A1 | 8/2008 | Tuominen et al. | 174/260 |
| 2008/0202801 A1 | 8/2008 | Tuominen et al. | 174/260 |
| 2008/0217709 A1 * | 9/2008 | Minervini et al. | 257/416 |
| 2008/0298621 A1 * | 12/2008 | Theuss et al. | 381/360 |
| 2008/0310670 A1 * | 12/2008 | Itakura | 381/412 |
| 2009/0001553 A1 * | 1/2009 | Pahl et al. | 257/704 |
| 2009/0096041 A1 * | 4/2009 | Sakakibara et al. | 257/419 |
| 2009/0101998 A1 * | 4/2009 | Yen et al. | 257/416 |
| 2009/0141913 A1 | 6/2009 | Mauer et al. | 381/174 |
| 2010/0067732 A1 * | 3/2010 | Hachinohe et al. | 381/394 |
| 2010/0142744 A1 * | 6/2010 | Rombach et al. | 381/355 |
| 2010/0164025 A1 * | 7/2010 | Yang | 257/416 |
| 2010/0202649 A1 | 8/2010 | Inoda et al. | 381/361 |
| 2010/0308450 A1 * | 12/2010 | Verjus et al. | 257/690 |
| 2011/0042762 A1 * | 2/2011 | Laming et al. | 257/416 |
| 2011/0073974 A1 * | 3/2011 | Takano et al. | 257/432 |
| 2011/0158439 A1 * | 6/2011 | Denison et al. | 381/174 |
| 2013/0032905 A1 * | 2/2013 | Lo et al. | 257/416 |
| 2013/0038926 A1 * | 2/2013 | Soer et al. | 359/350 |

FOREIGN PATENT DOCUMENTS

| | | | | |
|---|---|---|---|---|
| WO | WO 02/45463 A2 | 6/2002 | | H04R 19/00 |
| WO | WO 2005/086532 A2 | 9/2005 | | H04R 19/00 |
| WO | WO 2005/102911 A1 | 11/2005 | | B81B 7/00 |
| WO | WO 2006/061792 A2 | 6/2006 | | |
| WO | WO 2007/117198 A1 | 10/2007 | | B81B 7/02 |

OTHER PUBLICATIONS

Authorized Officer: Karel Peirs, International Search Report, PCT/US2011/056017, Jan. 11, 2012, 4 pages.

Authorized Officer: Karel Peirs, Written Opinion of the International Searching Authority, PCT/US2011/056017, Jan. 11, 2012, 7 pages.

Wolffenbuttel, R.F., "Microsystems for Multi-Sensory Data-Acquisition," *IEEE International Symposium and Industrial Electronics*, 1997, 6 pages.

\* cited by examiner

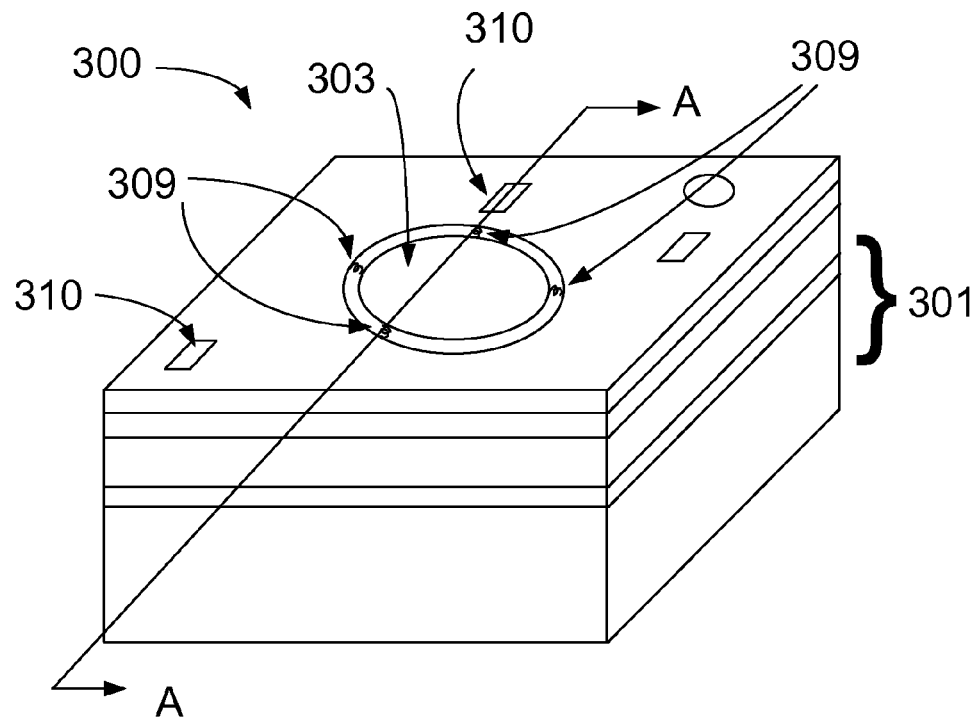
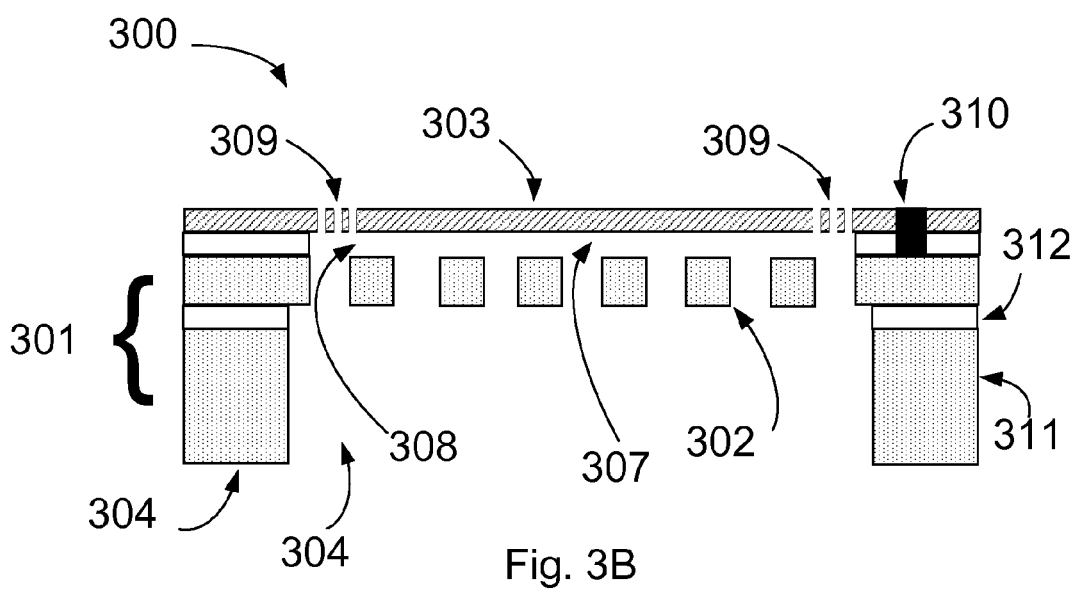
Fig. 3A
Fig. 3B

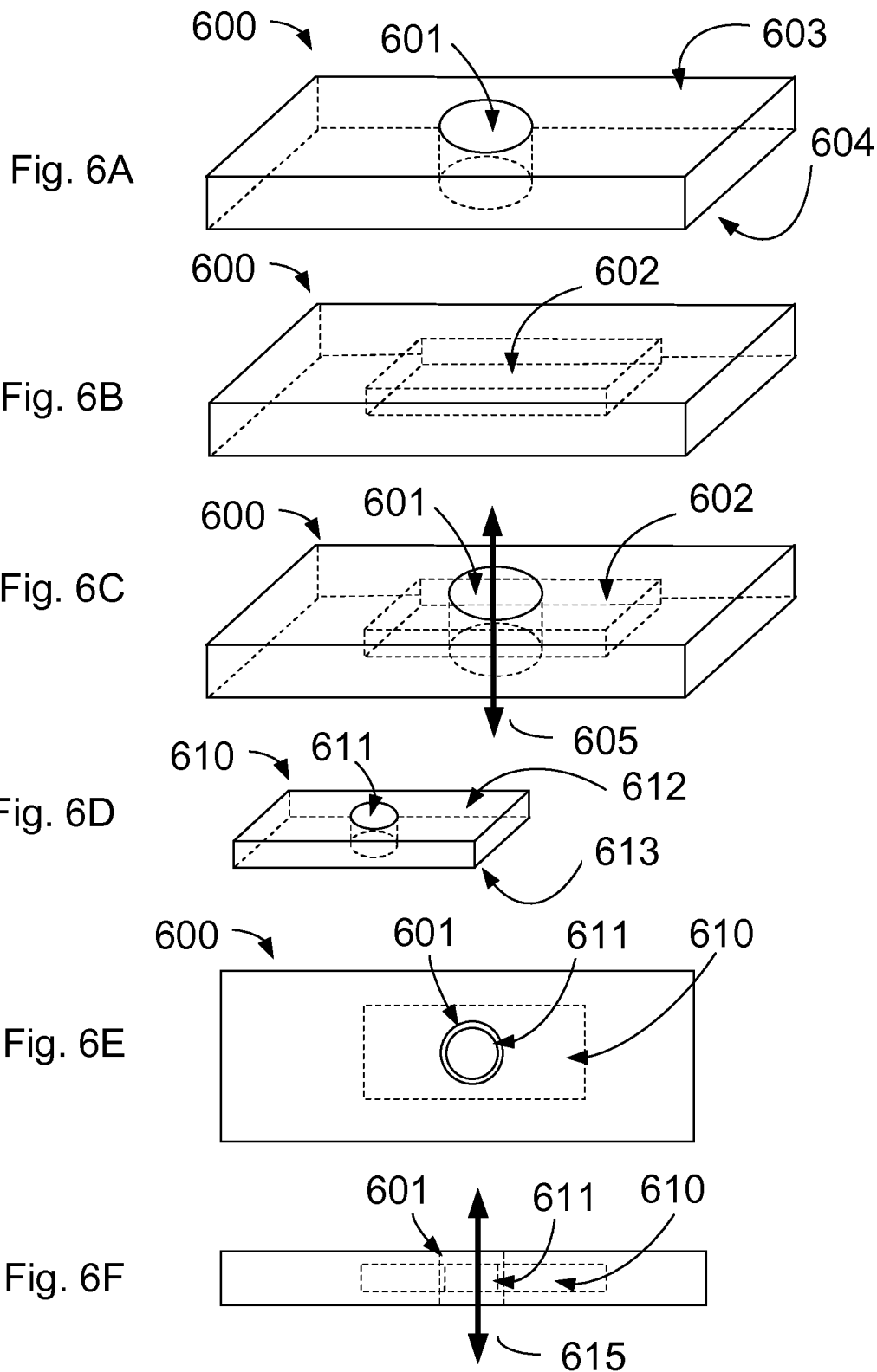

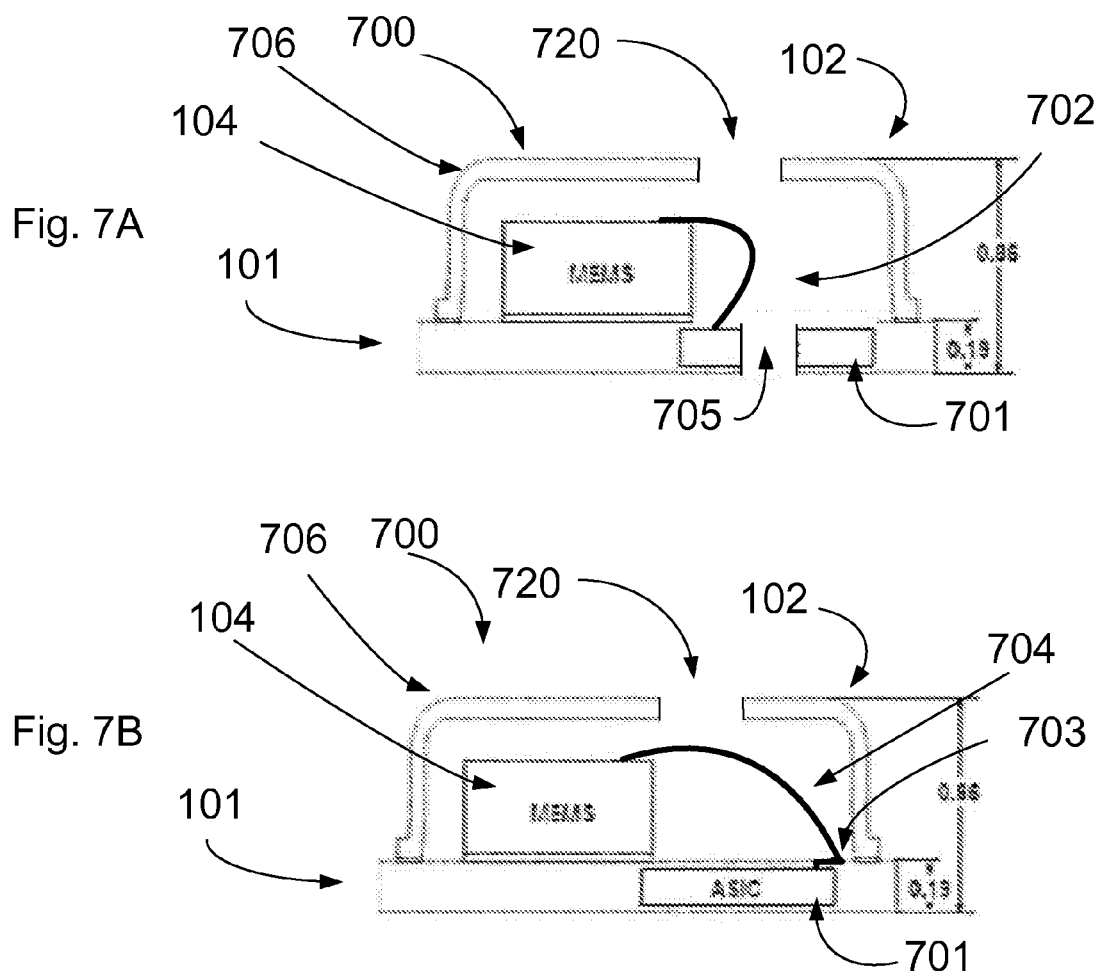

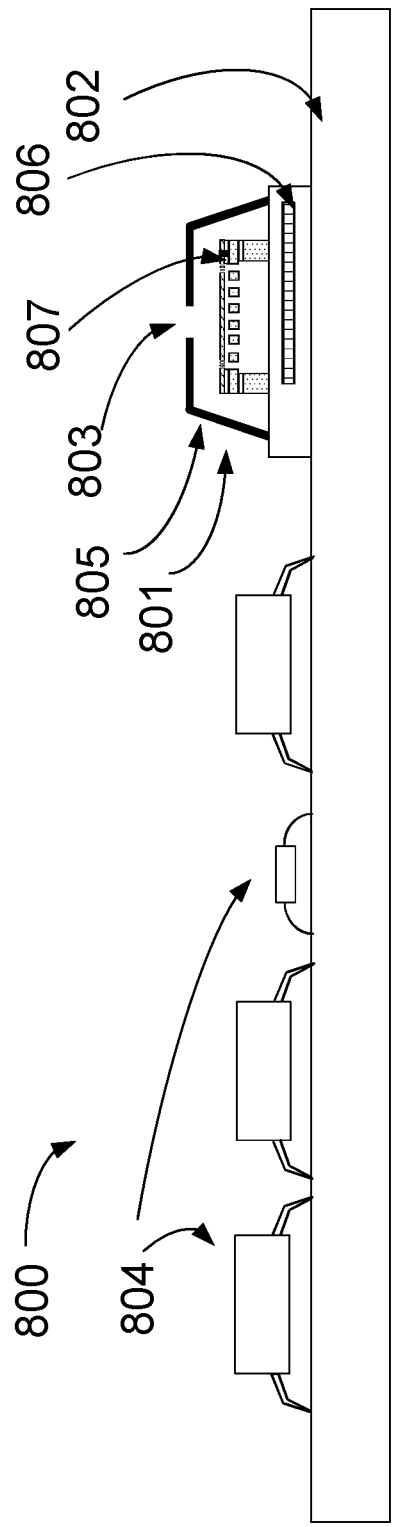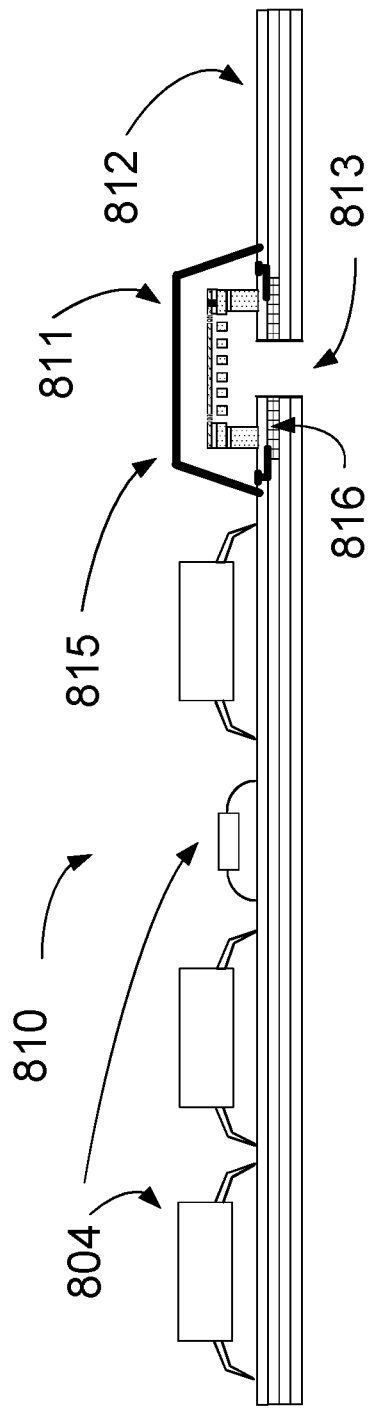

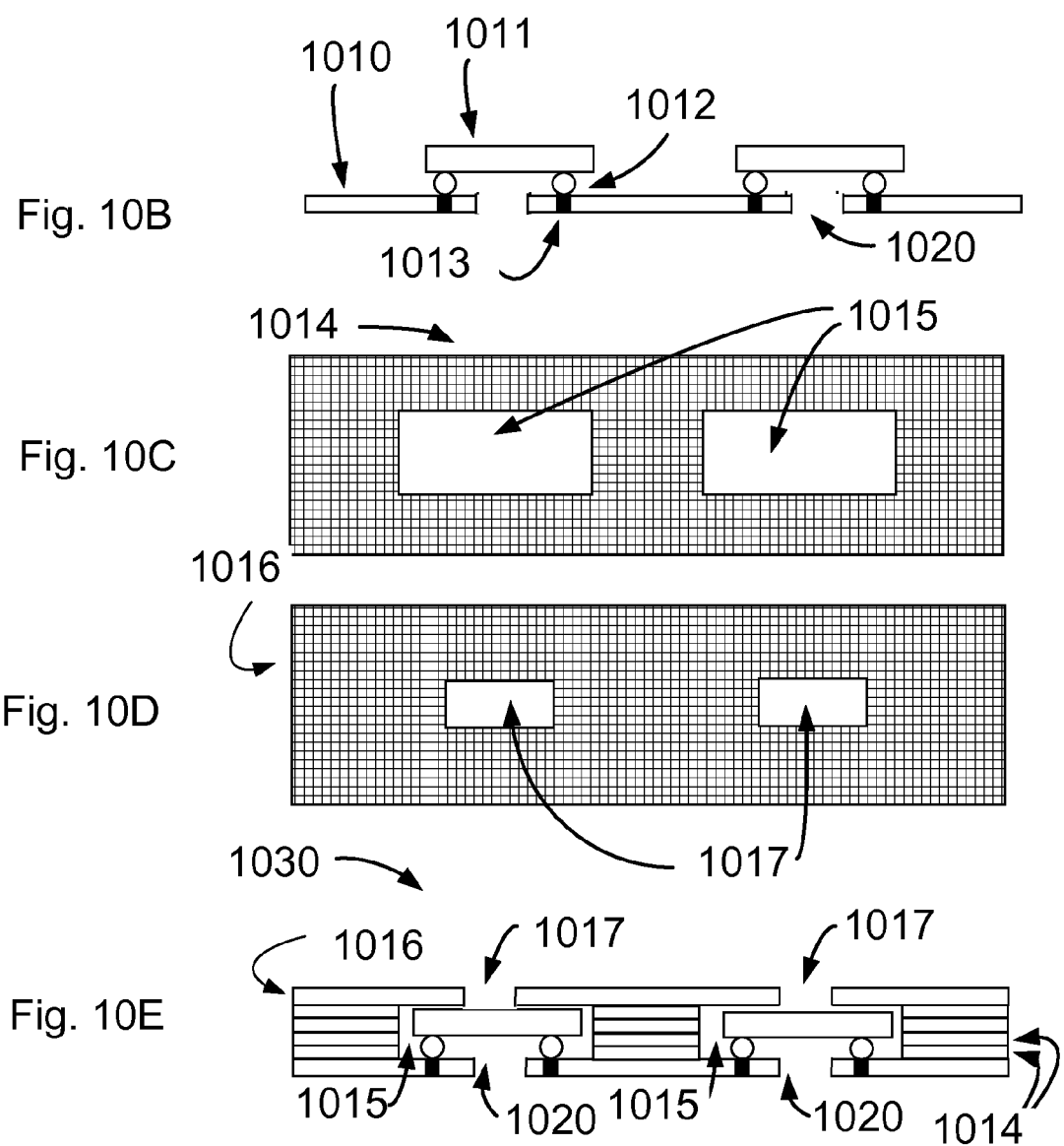

MICROPHONE PACKAGE WITH EMBEDDED ASIC

PRIORITY

This patent application claims priority from provisional U.S. patent application No. 61/392,322, filed Oct. 12, 2010, entitled, "Microphone Package with Embedded ASIC," and naming Michael D. Delaus, Kathy O'Donnell, and Thomas M. Goida as inventors [practitioner's file 2550/D09], the disclosure of which is incorporated herein, in its entirety, by reference.

TECHNICAL FIELD

The invention generally relates to microphones and, more particularly, the invention relates to MEMS microphone systems.

BACKGROUND ART

MEMS microphones typically are secured within a package to protect them from the environment. Some such packages have a base for supporting the microphone, and a lid secured to the base forming an interior. The volume of the interior, net of the volumes of the microphone and other components within the interior, may serve as a back-volume for the microphone.

One or more apertures through some portion of the package permit audio signals to reach the microphone. Receipt of the audio signal causes the microphone, with a corresponding integrated circuit chip, to produce an electronic signal representing the audio qualities of the received signal.

The integrated circuit chip, also mounted on the base within the package interior, processes electrical signals to and from the microphone. The base must have a surface area sufficient to accommodate both the microphone and integrated circuit chip. Further, the volume of the interior must be sufficient to accommodate both the microphone and integrated circuit, while still leaving unoccupied space to serve as the back-volume. Undesirably, this technique increases the footprint and volume of the overall packaged microphone.

SUMMARY OF THE EMBODIMENTS

In a first embodiment of the invention there is provided a microphone carrier, including a substrate having a first substrate side and a second substrate side, and a substrate aperture between the first substrate side and the second substrate side; an integrated circuit comprising a first IC side and a second IC side, and an IC aperture between the first IC side and the second IC side; wherein the integrated circuit embedded in the substrate, with IC aperture aligned with the substrate aperture. In some embodiments, the substrate aperture is coaxially aligned with the IC aperture. Some embodiments include a filter in the IC aperture. The filter may be a grid structure, for example.

Some embodiments also include a microphone mounted on the substrate, and in some embodiments the microphone includes a planar diaphragm, and is mounted astride the substrate aperture such that the plane of the diaphragm is parallel to the substrate.

In some embodiments, the substrate is a laminate. Some embodiments also include a cap mounted to the substrate and forming an interior volume, the cap covering the substrate aperture.

Another embodiment includes a substrate having a first side and a second side; a lid coupled to the first side, the substrate and the lid defining an interior volume; a microphone having microphone bond pads, the microphone coupled to the first side and within the interior volume; an integrated circuit comprising a surface, with IC bond pads on the surface, the integrated circuit embedded in the substrate; and wire bonds extending from the microphone bond pads to the IC bond pads. In some embodiments, the integrated circuit is embedded in the substrate below the microphone, while in other embodiments the integrated circuit is embedded in the substrate and spaced laterally from the microphone.

Some embodiments include an aperture in the lid, while some embodiments include an aperture in the substrate.

In some embodiments, the lid is conductive, and the lid and substrate form an electromagnetic shield around the microphone and integrated circuit.

Another embodiment provides a method of fabricating a microphone system, in which the method includes providing a substrate having a first substrate side and a second substrate side, the substrate having a void between the first substrate side and the second substrate side, and a substrate aperture extending between the first substrate side and the second substrate side, and intersecting the void; providing an integrated circuit having a first IC side and second IC side, the integrated circuit having an IC aperture extending between the first IC side and the second IC side; and placing the integrated circuit within the void, such that the integrated circuit is completely between the first substrate side and the second substrate side; providing a microphone on the first substrate side, the microphone having a diaphragm, and the diaphragm at least partially aligned with the substrate aperture.

In some embodiments, the substrate comprises a laminate. In some embodiments, the diaphragm is coaxially aligned with the substrate aperture.

Some embodiments further provide a lid mounted to the first substrate side, wherein the lid and the first substrate side form an interior volume, and wherein the microphone resides within the interior volume.

In some embodiments, the second substrate side includes at least one substrate electrical contact, and the integrated circuit includes at least one IC electrical contact, and wherein the method further comprises coupling the at least one substrate electrical contact to the at least one IC electrical contact. In some embodiments, the first substrate side includes at least one substrate electrical contact, and the integrated circuit includes at least one IC electrical contact, and wherein the method further comprises coupling the at least one substrate electrical contact to the at least one IC electrical contact.

BRIEF DESCRIPTION OF THE DRAWINGS

The foregoing features of embodiments will be more readily understood by reference to the following detailed description, taken with reference to the accompanying drawings, in which:

FIGS. 3A and 3B schematically illustrate a MEMS microphone;

FIGS. 6A-6F schematically illustrate an embodiment of a substrate including a compound aperture;

FIGS. 7A and 7B schematically illustrate embodiments of microphone systems;

FIGS. 8A and 8B schematically illustrate higher level systems including embodiments of microphone systems.

FIGS. 10A-10E schematically illustrate a method of fabricating a laminate substrate with an embedded integrated circuit.

DETAILED DESCRIPTION OF SPECIFIC EMBODIMENTS

In accordance with illustrative embodiments, a packaged microphone system is configured to effectively reduce the footprint of the package, as well reduce its volume. To those ends, the system has an integrated circuit embodied within a package base, and a microphone chip mounted on a surface of the package base. In some embodiments, the integrated circuit includes an aperture aligned with a corresponding aperture in the base to allow audio signals to enter the interior from outside of the base. The microphone chip and integrated circuit may be connected by wirebonds, or directly through contact pads.

Among other things, the base may include printed circuit board material, and/or the lid may include conductive material. The lid and base thus may form at least a partial electromagnetic shield about the interior.

Figure 1:
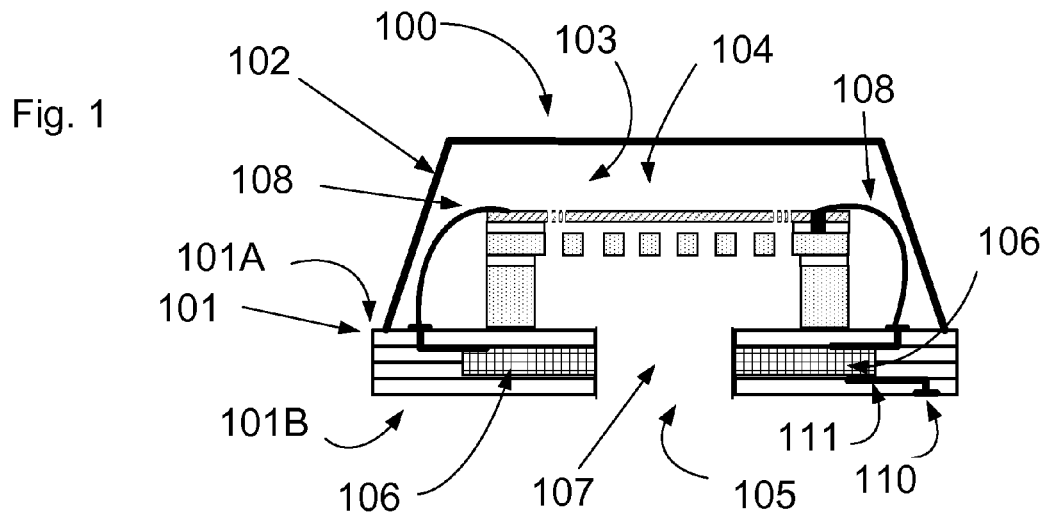
FIG. 1 schematically illustrates an embodiment of a microphone system.

FIG. 1 schematically illustrates a cross-sectional view of a packaged microphone system 100 including a base 101 and a lid 102, which together form an interior 103 of the package. The base 101 has a first side 101A and a second side 101B.

A microphone 104 is mounted within the interior 103. In this embodiment, the microphone 104 has a planar diaphragm (see diaphragm 303 in FIG. 3B, as just one example), and the microphone 104 straddles, or sits astride of, an aperture 105, such that sound energy can pass straight through the aperture an reach the microphone 104, and in particular, the microphone diaphragm. The base 101 of system 100, and the diaphragm of the microphone 104, are both substantially planar, and the plane of the diaphragm of the microphone 104 is substantially parallel to the plane of the base 101. The microphone 104 is mounted on the substrate 101 such that the diaphragm of the microphone 104 is above an aperture 105 in the base 101. In other words, in the embodiment of FIG. 1, a line drawn normal to the plane of the diaphragm of a microphone mounted above an aperture would pass through the aperture.

In some embodiments, the base 101 and/or the lid 102 may have an aperture (for example, aperture 105 in FIG. 1, or aperture 720 in FIG. 7A) that allow acoustic waves to enter the package interior 103 and impinge upon the microphone 104. Although not shown, the package in FIG. 1 could have an aperture in the lid (as in FIG. 7A), and the package in FIG. 7A could have an aperture in the substrate, beneath the microphone (as in FIG. 1).

An integrated circuit 106 ("IC"), which may be an application-specific integrated circuit ("ASIC"), is embedded in the base 101. From the perspective presented in FIG. 1, the integrated circuit (106) may be described as sitting "below" the microphone, in that a line normal to the plane of the diaphragm would pass through the integrated circuit 106. A base or substrate (such as substrate 101 for example) including an embedded integrated circuit (such as integrated circuit 106 for example) may be referred to as a "microphone carrier."

The integrated circuit 106 is electrically coupled to the microphone 104 by wirebonds 108, to process electrical signals produced by the microphone 104, and thereby produce the system's electrical output signal. In some embodiments, the integrated circuit 106 may, in turn, be coupled to a bond pad 110 on second side 101B of the base 101 by conductor 111.

This arrangement reduces the footprint of the package since the surface of the base need not be large enough to accommodate both the IC and the microphone. Also, the desired back-volume (i.e., the net volume of the interior) may be formed in a smaller package since the integrated circuit 106 does not occupy a portion of the interior volume 103.

The base 101 includes an aperture 105, and the integrated circuit 106 includes aperture 107. In the embodiment of FIG. 1, the apertures 105, 107 are aligned, and may be coaxially aligned, so that audio signals may enter the interior 103 through the aligned apertures. The apertures 105, 107 may be, but need not be, the same shape and/or same size, as long as acoustic energy can pass through the apertures to the interior.

Figure 2A:
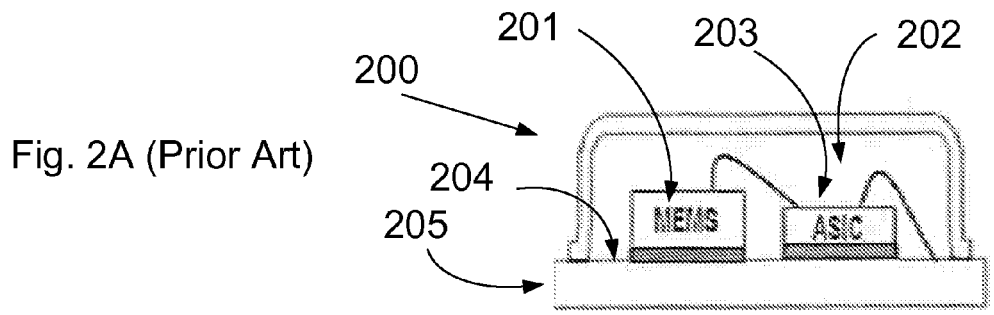
FIGS. 2A and 2B schematically illustrate prior art microphone packages.
Figure 2B:
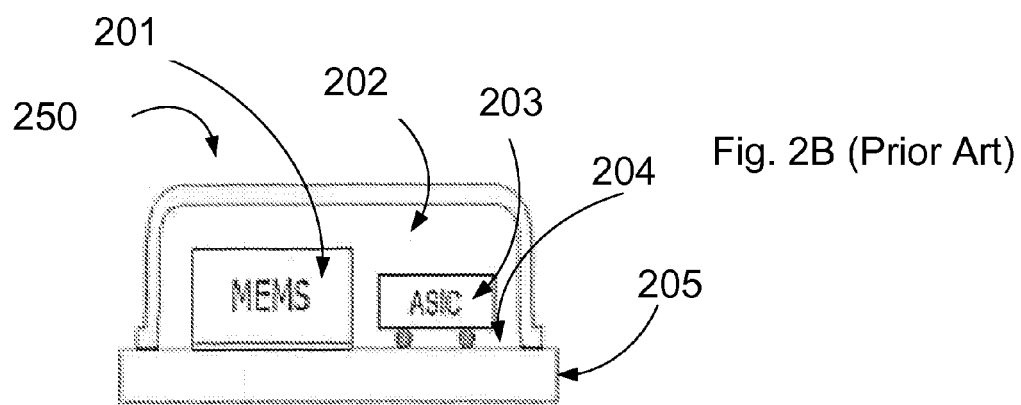

To contrast the features of the packaged microphone system 100 of FIG. 1, FIG. 2A and FIG. 2B schematically illustrate prior art packages 200 and 250 respectively. In each case, a microphone 201 occupies an interior 202 of a package, along with an integrated circuit 203. In each case, the integrated circuit 203 occupies space on the surface 204 of the base 205, and occupies volume. This requires that the base 205 be large enough to accommodate both the microphone 201 and integrated circuit 203 on a single surface (i.e., surface 204), and requires the interior volume 202 to be large enough to accommodate both the microphone 201 and integrated circuit 203, in addition to providing the desired back volume. As such, prior art microphone packaging techniques require packages larger than the embodiment of FIG. 1, for example.

FIG. 3A schematically shows a top, perspective view of a MEMS microphone chip 300 that may be used with illustrative embodiments of the invention. FIG. 3B schematically shows a cross-sectional view of the same MEMS microphone chip 300 along section A-A. These two figures are discussed to detail some exemplary components that may make up a microphone used in accordance with various embodiments.

As shown in FIGS. 3A and 3B, the microphone chip 300 has the chip base/substrate 301, one portion of which supports a backplate 302. The microphone 300 also includes a flexible diaphragm 303 that is movable relative to the backplate 302. The backplate 302 and diaphragm 303 are separated by a gap 308, and together form a variable capacitor. In illustrative embodiments, the backplate 302 is formed from single crystal silicon (e.g., a part of a silicon-on-insulator, or "SOI," wafer), while the diaphragm 303 is formed from deposited polysilicon. In other embodiments, however, the backplate 302 and diaphragm 303 may be formed from different materials.

In the embodiment shown in FIG. 3B, the microphone substrate 301 includes the backplate 302 and other structures, such as a bottom wafer 311 and a buried oxide layer 312 of an SOI wafer. A portion of the substrate 301 also forms a backside cavity 304 extending from the bottom 315 of the substrate 301 to the bottom of the backplate 302. To facilitate operation, the backplate 302 has a plurality of through-holes 307 that lead from gap 308 to the backside cavity 304.

It should be noted that various embodiments are sometimes described herein using words of orientation such as "top," "bottom," or "side." These and similar terms are merely employed for convenience and typically refer to the perspective of the drawings. For example, the substrate 301 is below the diaphragm 303 from the perspective of FIGS. 3A and 3B. However, the substrate 301 may be in some other orientation relative to the diaphragm 303 depending on the orientation of the MEMS microphone 300. Thus, in the present discussion, perspective is based on the orientation of the drawings of the MEMS microphone 300.

In operation, audio signals strike the diaphragm 303, causing it to vibrate, thus varying the gap 308 between the diaphragm 303 and the backplate 302 to produce a changing capacitance. Such audio signals may contact the microphone 300 from any direction. For example, the audio signals may travel upward, first through the backplate 302 to reach the diaphragm 303. In other embodiments, the audio signals may impinge on the diaphragm 303 on the side of the diaphragm opposite the backplate 302.

Figure 4A:
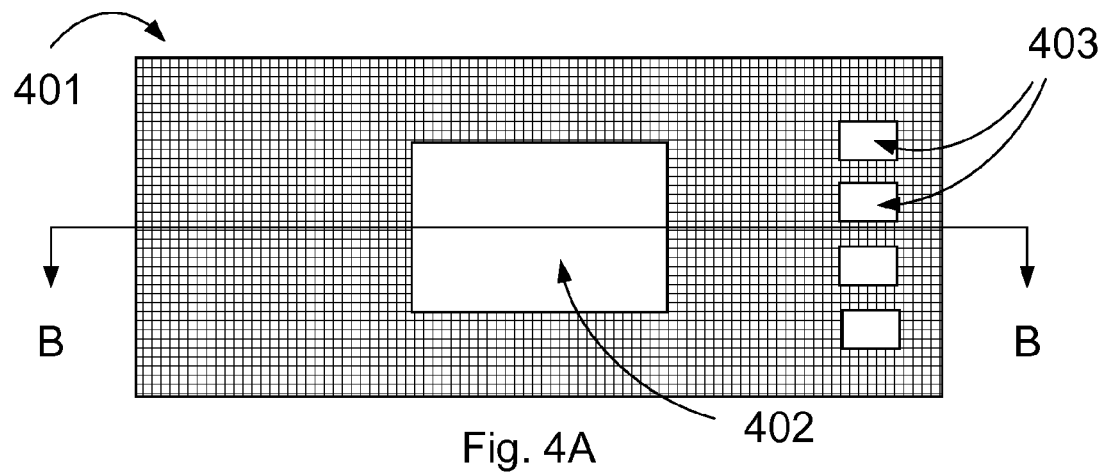
FIGS. 4A-4D schematically illustrate embodiments of an integrated circuit.
Figure 4B:
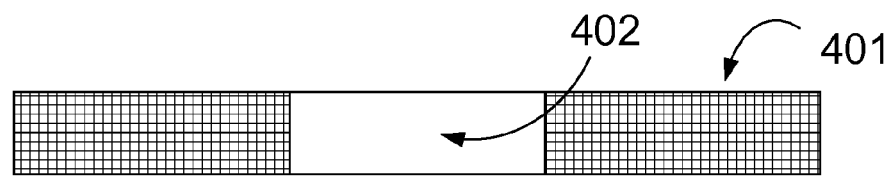

FIG. 4A schematically illustrates a plan view of an embodiment of an integrated circuit 401 with an aperture 402. Although the aperture 402 is rectangular in this embodiment, the aperture may take any of a variety of shapes. A cross-section of the integrated circuit 401 in FIG. 4A along section B-B is schematically illustrated in FIG. 4B.

In some embodiments, the integrated circuit may include bond pads or contacts 403, which may provide interconnections to a microphone by, for example, wire bonding or direct bonding of a microphone chip to the IC, or may provide interconnections to conductive traces within the base.

Figure 4C:
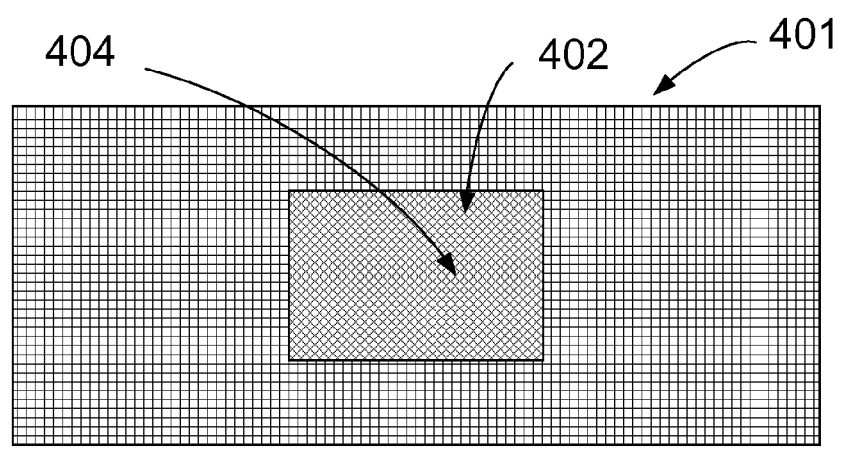

The integrated circuit 401 may include a filter 404 or other structure within the aperture, as schematically illustrated in FIG. 4C. Such a filter 404 or other structure may protect the microphone, and particularly the microphone diaphragm, from external forces or materials. The filter or structure 404 may comprise a grid structure. A grid structure could be fabricated in the integrated circuit 401, for example by etching an array of through-holes into the integrated circuit. The through-holes would be open passages to allow the transmission of acoustic energy.

Figure 4D:
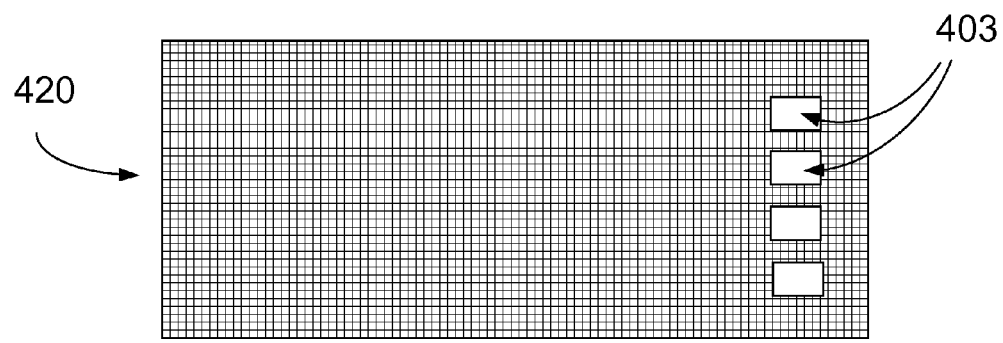

Another embodiment of an integrated circuit 420 is schematically illustrated in FIG. 4D. Integrated circuit 420 includes bond pads 423 similar to the bond pads 403 in integrated circuit 401. However, integrated circuit 420 does not have an aperture. Such an integrated circuit may be used, for example, in embodiments in which acoustical energy need not pass through the integrated circuit, such as the embodiments in FIG. 7B for example.

Figure 5A:
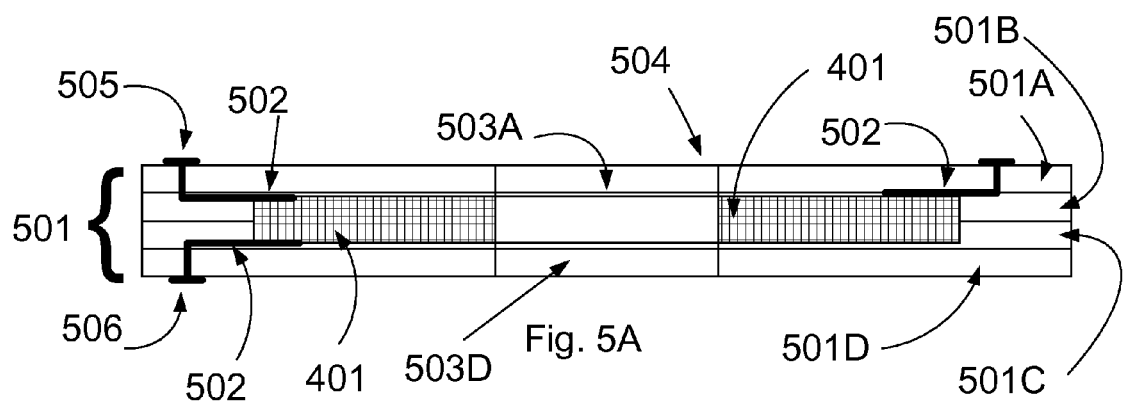
FIGS. 5A and 5B schematically illustrate embodiments of a substrate including an embedded integrated circuit.

A laminate base 501 with internal conductors 502 to take signals to and/or from an integrated circuit 401 to the microphone, or to bond pads for wirebonding to the microphone or to other connections, is schematically illustrated in FIG. 5A. A number of conductors 502 may connect to a corresponding number of pads, such as pads 505 and 506, on a various surfaces of the laminate base 501.

Each individual layer (501A-501D) has an aperture (such as layer apertures 503A and 503D, for example; illustrations of the layer apertures in individual layers 501B and 501C are omitted to avoid cluttering the figure), and the individual apertures align to form an aperture 504 through the laminate base 501. Although not illustrated, the laminate base could also have conductors on its top surface or bottom surface.

Figure 5B:
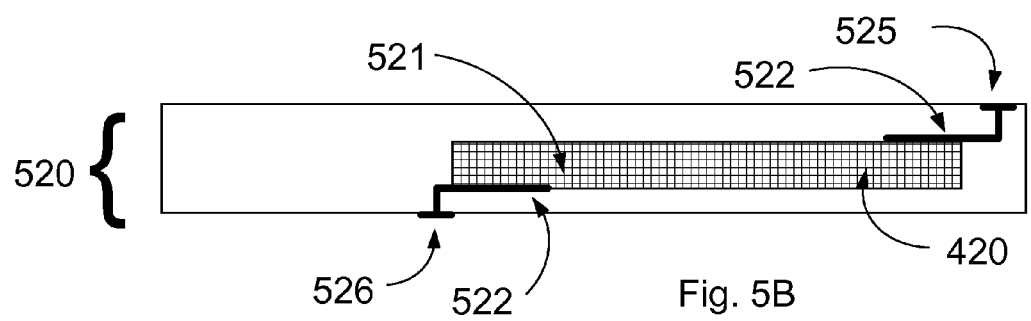

An alternate embodiment of a base 520 is schematically illustrated in FIG. 5B. Base 520 may be a solid material (i.e., not a laminate), such as a ceramic or plastic, to name but a few. Base 520 includes a void 521, which void 521 is occupied by integrated circuit 420. In some embodiments, base 520 may include an aperture, although no such aperture is illustrated in FIG. 5B. In any event, integrated circuit 420 does not include an aperture. A number of conductors 522 may connect to a corresponding number of pads, such as pads 525 and 526, on a various surfaces of the laminate base 520.

An embodiment of a substrate 600 with a substrate aperture 601 and a void 602 is schematically illustrated in FIGS. 6A-6C. The substrate 600 occupies a volume dictated by its external dimensions.

To facilitate the illustration, the substrate 600 with a substrate aperture 601, but without the void 602, is schematically illustrated in FIG. 6A. The substrate aperture 601 extends from a first side 603 to a second side 604 of the substrate 600, and defines a substrate aperture volume that is a subset of the volume of the substrate 600. In this embodiment, the substrate aperture 601 has a circular cross-section, such that it has a cylindrical volume, but other embodiments may have other cross-sections, such as square, rectangular, or oval, to name but a few. Further, in some embodiments the substrate aperture need not have a uniform cross-section through the substrate 600. The substrate aperture 601 forms a passage through the substrate 600, which passage is filled with a gaseous sound transmission medium (e.g., air). As such, the substrate aperture 601 may allow acoustical energy, in the form of sound waves, to pass through the substrate.

To further facilitate the illustration, the same substrate 600, with the void 602, but without the substrate aperture 601, is schematically illustrated in FIG. 6B. The void 602 has a volume of a shape and size sufficient to hold an integrated circuit. In this embodiment, the void 601 is completely within the volume of the substrate 600. In other embodiments, a void may intersect a surface of the substrate.

To further facilitate the illustration, the same substrate 600, with both the void 602 and the substrate aperture 601, is schematically illustrated in FIG. 6C. In this embodiment, if not for the substrate aperture 601, the void 602 would be completely isolated from the ambient atmosphere outside of the substrate 600. As illustrated in FIG. 6C, the volume of the substrate aperture 601 intersects the volume of the void 602. In other words, a portion of the volume of the substrate aperture 601 occupies the same space as a portion of the void 602. As such, in this embodiment there is a passage through the substrate 600, such that a linear object could pass through the substrate 601, as illustrated by double-headed arrow 605 (the double-headed arrow 605 is not part of the embodiment, and is provided only for illustration).

An embodiment of an integrated circuit 610 with an integrated circuit aperture 611 is schematically illustrated FIG. 6D. The integrated circuit 610 occupies a volume as dictated by its external dimensions, and the volume of the integrated circuit 610 is such that the integrated circuit will fit within the void 602 in the substrate 600. The integrated circuit 610 has an integrated circuit aperture 611 that extends from a first side 612 to a second side 613 of the integrated circuit 610. As such, the integrated circuit aperture 611 may allow acoustical energy, in the form of sound waves, to pass through the integrated circuit 610.

Finally, an embodiment of a substrate 600 assembled with an integrated circuit 610 occupying the void 602 is schematically illustrated in a plan view in FIG. 6E. In FIG. 6E, a portion of the integrated circuit 610, and the integrated circuit aperture 611, are visible within the substrate aperture 601. In the illustrated embodiment, the integrated circuit aperture 611 is circular, and has a smaller diameter than the circular substrate aperture 601, but this is not a requirement. The integrated circuit aperture 611 could be various shapes, and could be larger than, smaller than, or the same size as, the substrate aperture 601, for example.

A side-view of the same embodiment of a substrate 600 assembled with an integrated circuit 610 occupying the void 602 is schematically illustrated in FIG. 6F. This figure reveals that the volume of the integrated circuit aperture 611 intersects the volume of the substrate aperture 601 and the volume of the void 602. In other words, a portion of the volume of the integrated circuit aperture 611 occupies the same space as a portion of the volume of the substrate aperture 601 and the volume of the void 602. Indeed, in the embodiment of FIGS. 6E and 6F, the volume of the integrated circuit aperture is completely within the volume of the substrate aperture. In other embodiments, the integrated circuit aperture may intersect (e.g., overlap with) the volume of the substrate aperture, but not be completely with the volume of the substrate aperture.

In some embodiments, the substrate could include a mold compound, and the integrated circuit could be encapsulated within the mold compound. In such an embodiment, the integrated circuit would form its own void or space within the substrate at the time of encapsulation. In such an embodiment, the substrate void that houses the integrated circuit might not exist independently of the integrated circuit prior to fabrication of the system.

Such embodiments provide a passage through the substrate 600 and the integrated circuit 610 such that a linear object could pass through the substrate 600, as illustrated be double-headed arrow 615 in FIG. 6F (the double-headed arrow 615 is not part of the embodiment, and is provided only for illustration). A passage in which at least a portion of the volume of a substrate aperture occupies the same space as at least a portion of the volume of an integrated circuit aperture, such that linear object could pass through the substrate and the integrated circuit, may be referred to as a "compound aperture." In illustrative embodiments, the placement and dimensions of a compound aperture within a microphone system are such that acoustical energy, in the form of sound waves, may pass through the substrate and the integrated circuit. In this way, sound on one side of a substrate may reach a microphone on the other side of the substrate, for example.

FIG. 7A schematically illustrates an alternate embodiment 700, in which the embedded integrated circuit 701 is laterally offset from the microphone 104. In other words, the integrated circuit 701 (or at least a portion of the integrated circuit 701) is not directly beneath the microphone 104. This embodiment also makes efficient use of space and volume, and may facilitate interconnections between the microphone 104 and integrated circuit 701, for example.

The integrated circuit 701 may have an aperture aligned with a corresponding aperture in the base 101 to form compound aperture 705. Alternately, some embodiments may have an aperture 720 in the lid 706. Still other embodiments may include both a compound aperture 705 and an aperture 720 in the lid 706.

In this illustrative embodiment, the microphone is electrically connected to the IC by a wirebond 702. Such wirebonding may be facilitated by the inclusion of bond pads (e.g., 403) on the integrated circuit (e.g., 401 or 420), and access to the bond pads may be facilitated by offsetting their location from the microphone 104, so that the bond pads are not beneath the microphone, or so near the microphone 104 that the microphone 104 impedes wirebonding.

In alternate embodiments, the integrated circuit and microphone may be electrically interconnected via conductive paths within the substrate. This may reduce or eliminate stray capacitances between the circuits. For example, the integrated circuit 701 MEMS microphone 104 in FIG. 7B may connect to an electrical contact 703 on the substrate 101 by a wirebond 704, which may in turn connect to the embedded integrated circuit 701 (see also the conductor 502 in FIG. 5A, for example). Some embodiments may also electrically connect the integrated circuit 701 to contacts, such a bond pads, on the side of the substrate 101 opposite the lid 706. Such an electrical connection may include a conductor 522 and bond pad 526 as in FIG. 5B, for example.

FIGS. 8A and 8B schematically illustrate embodiments of microphone systems in use as part of a higher-level system. In the higher level system 800 in FIG. 8A, a microphone system 801 is mounted to a larger substrate 802. The larger substrate 802 may be a rigid or flexible printed circuit board, or other base, for example. In this embodiment, microphone system 801 has an aperture 803 in its lid 804. The microphone system 801 includes an embedded integrate circuit 806. The integrated circuit 806 is electrically coupled to the microphone 807, and may also be coupled to the substrate 802 by conductors and bond pads as described in connection with previous embodiments.

In the higher level system 810 in FIG. 8B, the substrate 812, on which a packaged microphone system 811 is mounted and in which integrated circuit 816 is embedded, is larger than the lid 815, so that other system components 804 may be mounted on the same substrate 812. Although substrate 812 is illustrated as a laminate, the substrate 812 could be a solid, or even a molded body. In higher level system 810, a compound aperture 813 allows passage of acoustic energy.

Figure 9:
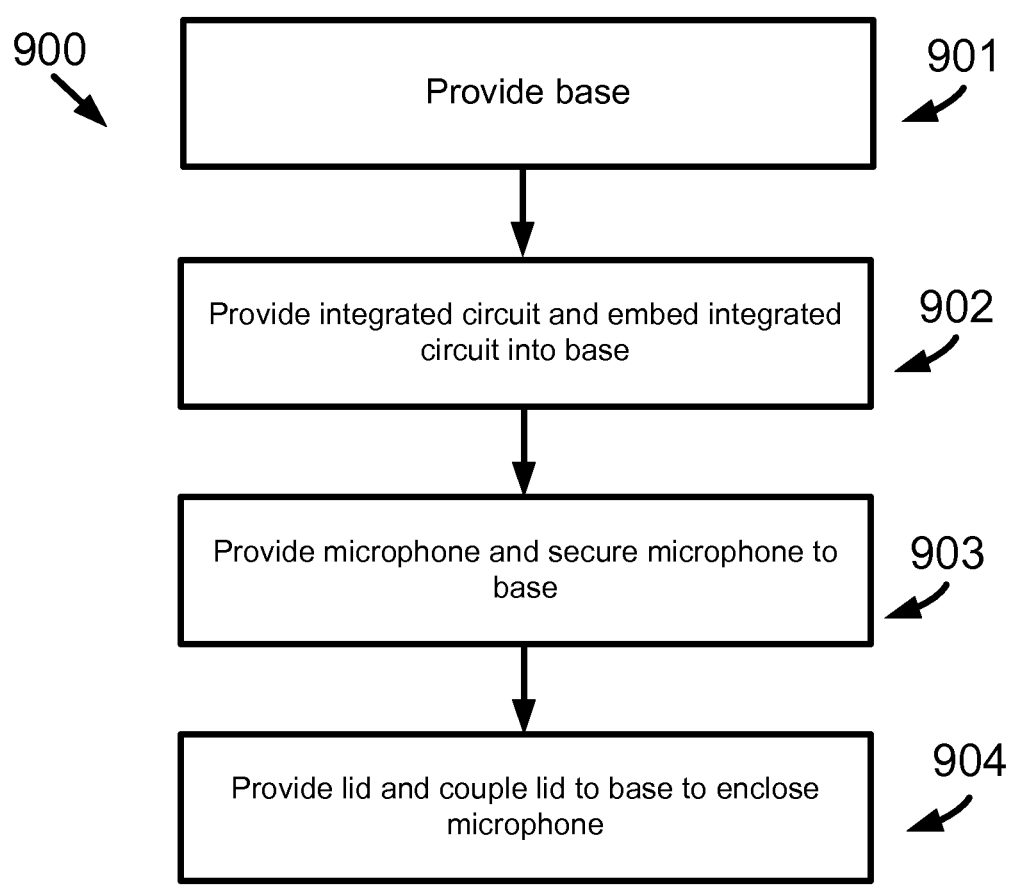
FIG. 9 is a flow chart of a method of fabricating a microphone system.

A method for fabricating a microphone system is illustrated by the flow chart 900 in FIG. 9. The first step 901 in the flow chart 900 provides a base or substrate for the microphone system. The base may be a laminate or a solid base, and may be rigid or flexible, and may even be a molded body. The base/substrate may include an aperture to allow sound transmission through a gaseous medium from one side of the substrate to the opposite side. In some embodiments, the substrate may include conductors to allow connections from a surface of the substrate to an embedded integrated circuit.

Step 902 provides an integrated circuit to be embedded within the substrate. In some embodiments, the substrate has a void prepared to accept and host the integrated circuit, or the substrate may be molded around the integrated circuit. However, not all substrates initially include such a void; the void may be created as the integrated circuit is imbedded, as in the embodiment in FIGS. 10A-10E as just one example.

In some embodiments, the integrated circuit has an integrated circuit aperture to align with a corresponding aperture in the substrate, to form a compound aperture. Some embodiments of the integrated circuit include bond pads to couple the integrated circuit to other electrical components, such as a MEMS microphone, or downstream circuitry, for example.

Step 903 provides a microphone to be mounted to the substrate, such as a micromachined (i.e., "MEMS") microphone, for example. If the substrate includes an aperture, step 903 may include mounting the microphone to straddle the aperture, such that acoustic energy that passes straight through the aperture will impinge on the diaphragm of the microphone. In some embodiments, step 903 also includes electrically coupling the microphone to the integrated circuit provided in Step 902.

Step 904 provides a cap or lid to mount to the substrate and cover the microphone, so as to provide an internal volume in which the microphone resides. The volume of the internal space, net of the volume of the microphone and any other components within the internal space, forms the back-volume for the microphone. In some embodiments, the lid may be conductive, so that the lid and substrate may form an electromagnetic shield (e.g., a Faraday cage) around the microphone. Together, the substrate and the lid provide a protective housing to shelter the microphone from external objects, forces and environmental conditions, which housing should be smaller than prior art packages.

Figure 10A:
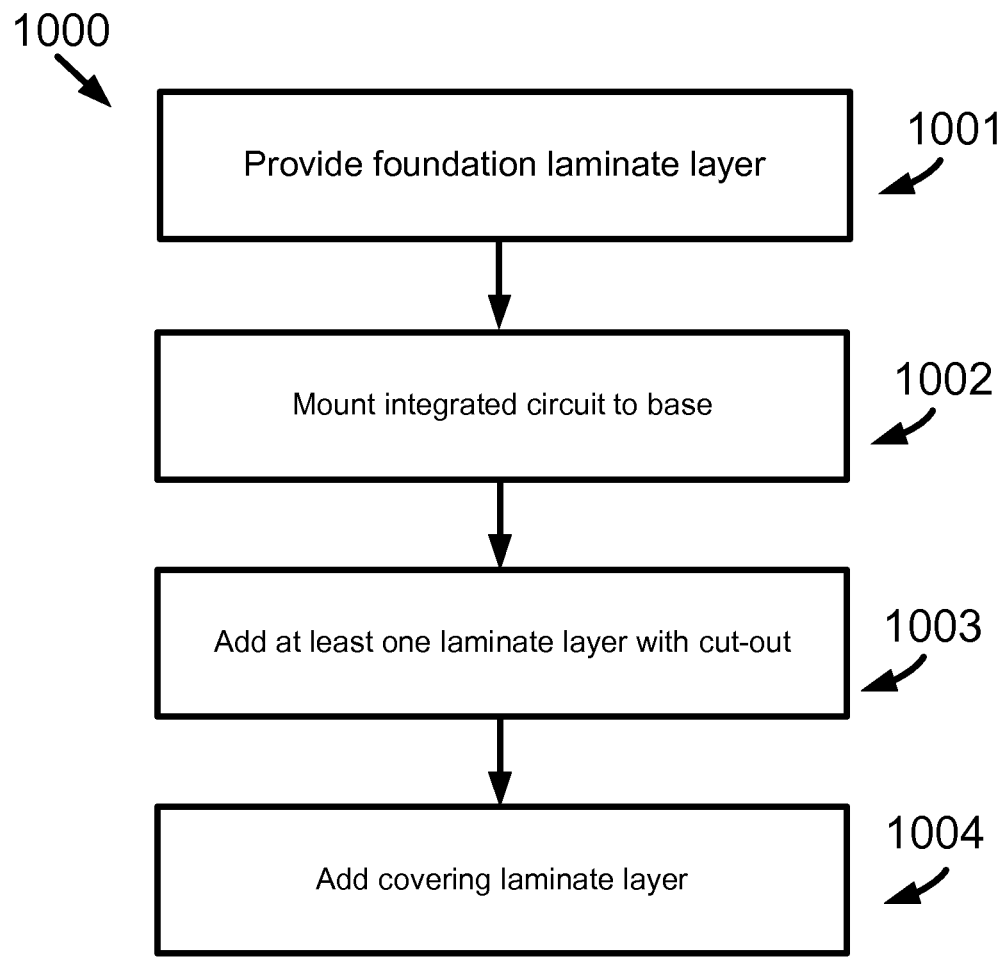

An embodiment of a method of fabricating a laminate substrate with an embedded integrated circuit is schematically illustrated along with a flow chart in FIG. 10A, and various components and structures are schematically illustrated in FIGS. 10B-10E. In this embodiment, the inclusion of an integrated circuit is performed as part of fabricating the laminate substrate 1030. The process 1000 begins by providing 1001 a foundation layer 1010 of the laminate substrate 1030. If the system being fabricated requires an aperture adjacent to the integrated circuit (e.g., to form a compound aperture, in some embodiments), the foundation layer may include a foundation aperture 1020.

Then, at step 1002, an integrated circuit 1011 is mounted to the foundation layer 1010. The integrated circuit may have conductive bumps 1012 that meet vias 1013 through the foundation layer, as illustrated in FIG. 10B, although other interconnection methods could be used. In some embodiments, the integrated circuit 1011 also includes an integrated circuit aperture. A side-profile of a foundation layer 1010 with integrated circuits 1011 is schematically illustrated in FIG. 10B.

At step 1003, at least one intermediate laminate layer 1014 is added to the foundation layer. Each intermediate layer 1014 includes at least one cut-out 1015. An embodiment of an intermediate layer is schematically illustrated in FIG. 10C. The cut-out 1015 has a shape and size sufficient to allow the integrated circuit 1011 to fit within the cut-out 1015, so that the intermediate layer can rest on the layer below. In other words, when an intermediate layer 1014 is stacked on a layer below (such as a foundation layer 1010 or another intermediate layer 1014), the integrated circuit passes through the cut-out 1015. In this way, one or more intermediate layers may be stacked.

Next, at step 1004, at least one covering laminate layer 1016 is added. Each covering laminate layer may have an aperture 1017 adjacent to the integrated circuit, so together the foundation layer 1010, the laminate layers 1014 and 1016 and the integrated circuit 1011 form a compound aperture. Typically, aperture 1017 is smaller than cut-out 1015. An embodiment of a covering laminate layer 1016 is schematically illustrated in a plan view in FIG. 10D. A side-profile of a laminate base 1030 is schematically illustrated in FIG. 10E. Together, apertures 1017 and 1020 form a substrate aperture. The laminate base 1030 may then be singulated into individual substrates, each with an encapsulated integrated circuit 1011, by cutting the laminate base 1030 in-between the integrated circuits 1011 using methods known in the art.

In an alternate embodiment, the covering laminate layer 1016, and/or the foundation layer 1010, may not include apertures for the formation of compound apertures. In such embodiments, if a compound aperture is desired, apertures through the covering laminate layer 1016 and/or the foundation layer 1010 may be provided after the laminate substrate is formed. Such apertures (illustrated in FIG. 10E as 1017 and 1020) may be formed by drilling or cutting a hole in one or more laminate layers. For example, a laser cutting tool may be used to cut a passage through the laminate layers 1014, 1016. Indeed, in some embodiments, the drill or cutting tool may even form an integrate circuit aperture through the embedded integrated circuit 1011.

Definitions. As used in this description and the accompanying claims, the following terms shall have the meanings indicated, unless the context otherwise requires:

The term "aligned" used in reference to two apertures means that the facial profiles of the apertures overlap such that a linear object could pass through both apertures. The term "coaxially aligned" means that the volume of one aperture is completely contained within the volume of the other aperture.

The term "integrated circuit" (or "IC") means a doped semiconductor containing active circuitry, such as a silicon or gallium arsenide device having a plurality of transistors, for example.

The term "embedded" used in reference to an integrated circuit and a substrate means that the volume of the integrated circuit is at least partly within the volume of the substrate. An integrated circuit may be embedded (or "completely embedded") within a substrate if the volume of the integrated circuit is completely within the volume of the substrate, as schematically illustrated by integrated circuit 106 within substrate 101 in FIG. 1. Similarly, an integrated circuit may be embedded within a substrate if a the volume of the integrated circuit is within the volume of the substrate, and the surface of the integrated circuit is co-extensive (e.g., co-planar) with a surface of the substrate, as schematically illustrated by integrated circuit 701 within substrate 101 in FIG. 7A, for example. An integrated circuit may be partially embedded within a substrate if a portion, but less than all, of the volume of the integrated circuit is within the volume of the substrate.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A microphone carrier comprising:
   laminate base having an aperture extending through the laminate base uninterrupted;
   a microphone comprising:
      a microphone substrate disposed on top of the laminate base and comprising a backside cavity;
      a diaphragm suspended from the microphone substrate and spanning the backside cavity;
   an integrated circuit chip (IC) comprising a first IC chip side and a second IC chip side, and an IC chip aperture disposed between the first IC chip side and the second IC chip side, the IC chip being embedded in the laminate base, in its entirety, and the IC chip aperture being aligned with the aperture extending through the laminate base uninterrupted so as to allow audio signals to enter the aligned IC aperture and the aperture.

2. The microphone carrier according to claim 1, wherein the aperture is coaxially aligned with the IC chip aperture.

3. The microphone carrier according to claim 1, wherein the microphone comprises a planar diaphragm, and is mounted astride the aperture such that the plane of the diaphragm is parallel to the substrate.

4. The microphone carrier according to claim 1, wherein the substrate is a laminate.

5. The microphone carrier according to claim 1, further comprising a cap mounted to the substrate and forming an interior volume, the cap covering the aperture.

6. The microphone carrier according to claim 1, wherein the IC aperture further comprises a filter.

7. The microphone carrier according to claim 6, wherein the filter comprising a grid structure.

8. A microphone system comprising:
   a substrate comprising a first side and a second side;
   a lid coupled to the first side, the substrate and the lid defining an interior volume;
   a microphone having a microphone substrate disposed on top of the substrate and comprising a backside cavity, the microphone further having microphone bond pads, the microphone coupled to the first side and within the interior volume and having a laminate base with an aperture extending through the laminate base uninterrupted;

an integrated circuit (IC) chip comprising a surface, with IC bond pads on the surface, the integrated circuit chip embedded, in its entirety, in the substrate and including an IC aperture aligned with the aperture so as to allow audio signals to enter the aligned IC aperture and the aperture; and wire bonds extending from the microphone bond pads to the IC bond pads.

9. The microphone system according to claim 8, further comprising an aperture in the lid.

10. The microphone system according to claim 8, further comprising an aperture in the substrate.

11. The microphone system according to claim 8, wherein the integrated circuit chip is embedded in the substrate below the microphone.

12. The microphone system according to claim 8, wherein the integrated circuit chip is embedded in the substrate and spaced laterally from the microphone.

13. The microphone system according to claim 8, wherein the lid is conductive, and the lid and substrate form an electromagnetic shield around the microphone and integrated circuit chip.

14. A microphone carrier comprising:
   a laminate base having an aperture extending through the laminate base uninterrupted;
   a microphone comprising:
      a microphone substrate disposed on top of the laminate base and comprising a backside cavity;
      a diaphragm suspended from the microphone substrate and spanning the backside cavity;
   an integrated circuit (IC) chip embedded in the laminate base, in its entirety, and including an IC aperture, the IC disposed laterally with the aperture with the IC aperture being aligned with the aperture so as to allow audio signals to enter the aligned IC aperture and the aperture.

15. The microphone carrier according to claim 14, wherein the microphone comprises a planar diaphragm, and is mounted astride the aperture such that the plane of the diaphragm is parallel to the laminate base.

16. The microphone carrier according to claim 14, further comprising a cap mounted to the substrate and forming an interior volume, the cap covering the aperture.

* * * * *